United States Patent
Villa et al.

(10) Patent No.: US 12,406,909 B2
(45) Date of Patent: Sep. 2, 2025

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventors: Riccardo Villa, Milan (IT); Matteo De Santa, Lombardia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 617 days.

(21) Appl. No.: 17/848,958

(22) Filed: Jun. 24, 2022

(65) Prior Publication Data
US 2023/0005826 A1   Jan. 5, 2023

(30) Foreign Application Priority Data
Jun. 30, 2021   (IT) .......................... 102021000017207

(51) Int. Cl.
H01L 23/495   (2006.01)
H01L 21/48   (2006.01)

(52) U.S. Cl.
CPC .... H01L 23/49548 (2013.01); H01L 21/4825 (2013.01); H01L 23/49524 (2013.01)

(58) Field of Classification Search
CPC ........... H01L 21/4825; H01L 23/49524; H01L 23/49548; H01L 23/5386; H01L 2224/404; H01L 2224/484; H01L 2224/49171; H01L 24/46
See application file for complete search history.

(56) References Cited

U.S. PATENT DOCUMENTS

| | | | |
|---|---|---|---|
| 2007/0108601 A1 * | 5/2007 | Ong | H01L 23/49562 |
| | | | 257/E23.044 |
| 2011/0147928 A1 | 6/2011 | Haba et al. | |
| 2012/0119343 A1 | 5/2012 | Bayan et al. | |
| 2012/0326287 A1 | 12/2012 | Joshi et al. | |
| 2015/0187684 A1 | 7/2015 | Myung et al. | |
| 2020/0176371 A1 | 6/2020 | Ise et al. | |

FOREIGN PATENT DOCUMENTS

| | | |
|---|---|---|
| CN | 112185923 A | 1/2021 |
| CN | 218123353 U | 12/2022 |

OTHER PUBLICATIONS

IT Search Report and Written Opinion for priority application, IT 102021000017207, report dated Mar. 2, 2022, 7 pgs.
CN First Office Action and Search Report for counterpart CN Appl. No. 202210758261.4, report dated Jul. 25, 2025, 6 pgs.

* cited by examiner

*Primary Examiner* — Brook Kebede
(74) *Attorney, Agent, or Firm* — Crowe & Dunlevy LLC

(57) ABSTRACT

A semiconductor chip is arranged over a substrate in the form of a leadframe. A set of current-carrying formations configured as conductive ribbons are coupled to the semiconductor chip. The substrate does not include electrically conductive formations for electrically coupling the conductive ribbons to each other. Electrical contacts are formed via wedge bonding, for instance, between adjacent ones of the conductive ribbons so that a contact is provided between the adjacent ones of the conductive ribbons in support of a multi-formation current-carrying channel.

12 Claims, 3 Drawing Sheets

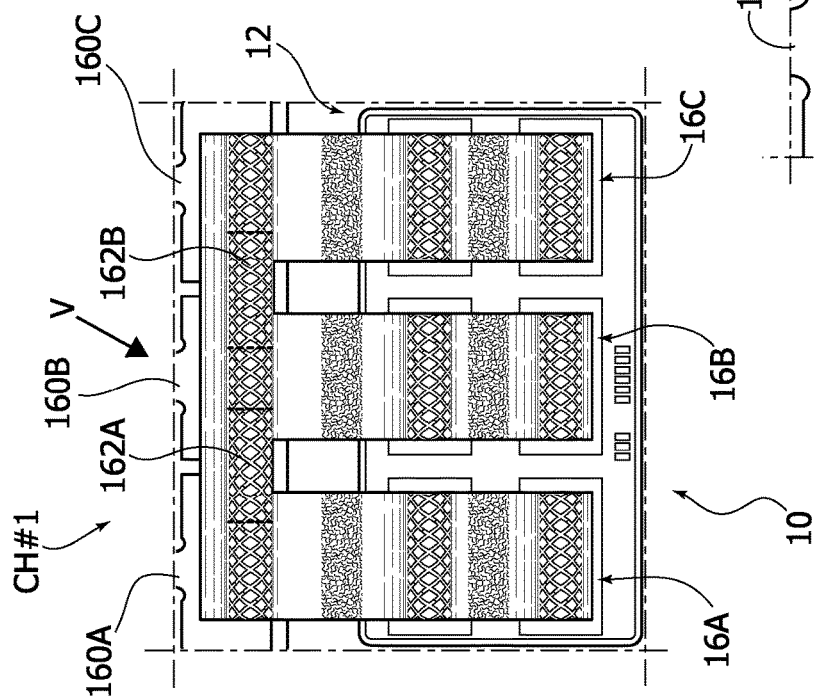
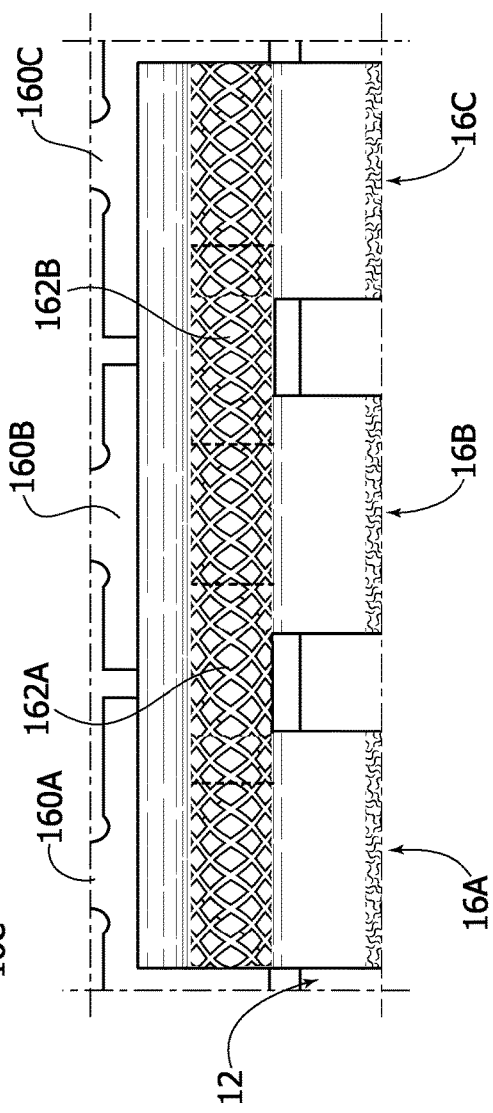
FIG. 4
FIG. 5

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102021000017207, filed on Jun. 30, 2021, the content of which is hereby incorporated by reference in its entirety to the maximum extent allowable by law.

TECHNICAL FIELD

The description relates to semiconductor devices.

One or more embodiments can be applied to semiconductor power devices for the automotive, consumer, and industrial market.

BACKGROUND

Devices with different numbers of power channels are used in power applications.

From a package perspective, this translates into different types of leadframe designs that take into account the number of channels involved.

Such leadframe customization has a reduced impact on board size and is advantageous for the final customer, who is relieved from any subsequent burden at board design level (e.g., shorting leads).

From the viewpoint of the supply chain of the components, managing several leadframe versions, some of which may be dedicated just to a small number of products, is largely inconvenient.

Increasing the standardization of leadframe designs, especially for power applications, is thus a goal to pursue in order to reduce cost and time to market.

SUMMARY

One or more embodiments relate to a method.

One or more embodiments relate to a corresponding semiconductor device. A power semiconductor device may be exemplary of such a device.

The embodiments take advantage of the possibility of packaging a multi-channel leadframe (e.g., of the Quad Flat No-lead (QFN) type) and bridging adjacent channels as desired for the final product via wedge-to-wedge ribbon bonding.

Such an approach provides flexibility in using both single-channel product versions and multi-channel product versions, with advantageous consequences in terms of cost in comparison with board redesign.

The embodiments can be applied advantageously, for instance, to QFN packages having embedded power drivers or to discrete power devices such as silicon MOSFET transistors and GaN field-effect transistors.

The embodiments may exhibit, for instance, wedge-on-wedge bridges between leads, with multi-channel copper leadframe design and short-circuit wedge-to-wedge ribbons.

One or more embodiments may provide advantages such as, for instance: ease of use on existing wire bonding machines; essentially a plug-&-play process (a bonding process as conventional in back-end manufacturing for interconnection purposes) is involved; extended applicability to several types of leadframe packages; cost savings related to possible leadframe design standardization; advantageous cost in comparison with board re-design; and selectivity in so far as wires and conductive ribbons can be customized as a function of the expected application.

An extra-step during wire bonding process is involved in bonding wires/ribbons and bridge leads. This can be estimated to produce a 5% throughput decrease (worst-case scenario), which is largely compensated by improved leadframe standardization.

BRIEF DESCRIPTION OF THE DRAWINGS

One of more embodiments will now be described, by way of example only, with reference to the annexed figures, wherein:

FIG. 4 is a plan view of a semiconductor device; and

FIG. 5 is a view of the portion of FIG. 4 indicated by arrow IV, reproduced on an enlarged scale.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Figures 1A, 1B, 1C:
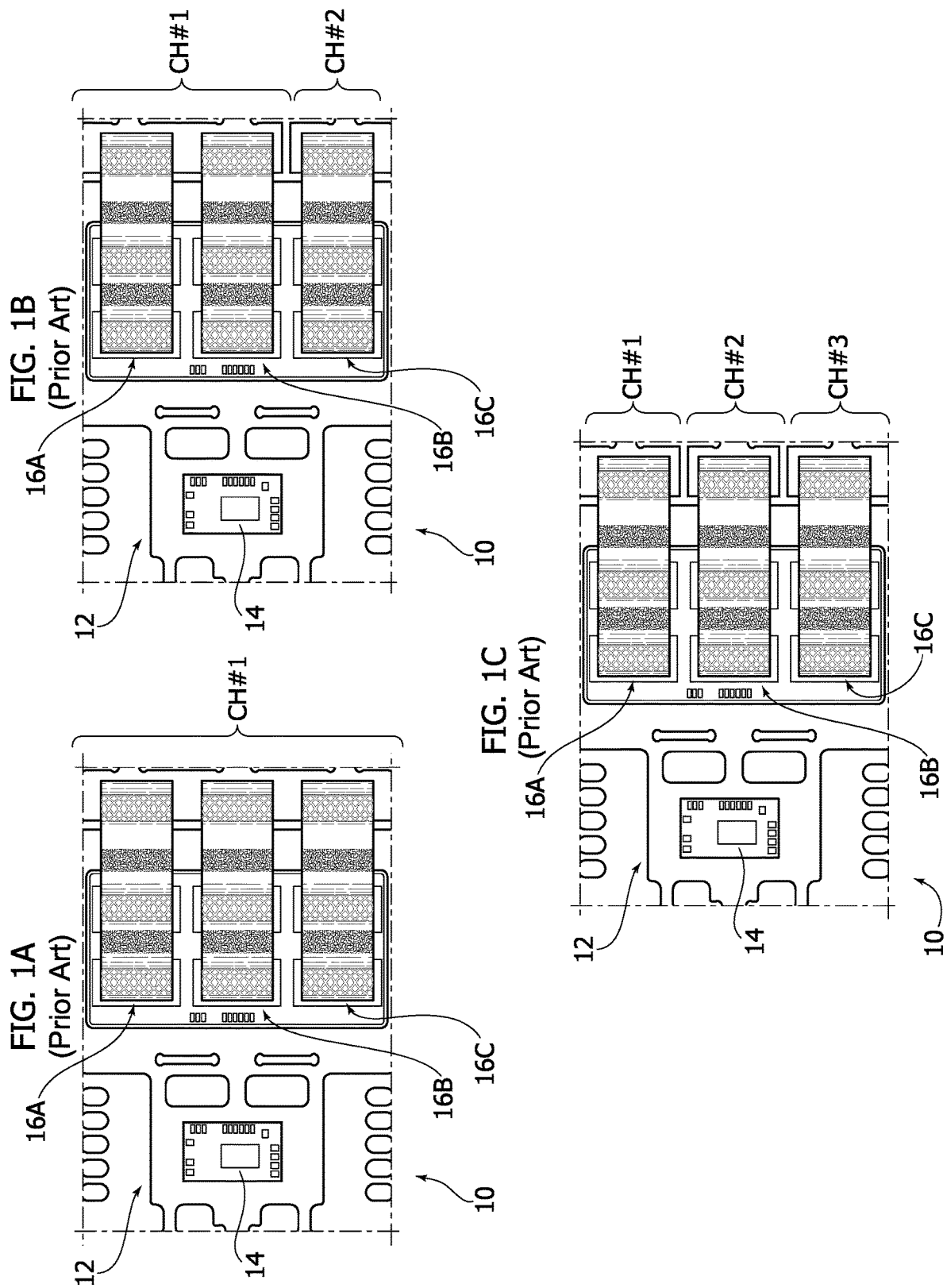
FIGS. 1A, 1B and 1C are plan views of conventional semiconductor devices.

FIGS. 1A, 1B and 1C are plan views of conventional semiconductor power devices 10.

As illustrated, the devices 10 comprise a substrate such as a leadframe 12 having arranged (attached) thereon one or more semiconductor integrated circuit chips or dice. One of these, indicated at reference 14, is clearly visible on the left-hand side of FIGS. 1A, 1B and 1C.

One or more other chips are only partly visible on the right-hand side of FIGS. 1A, 1B and 1C as they are masked by a plurality of "conductive ribbons" 16A, 16B, 16C—three are illustrated by way of example—providing (power) signal propagation paths The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Leadframes are conventionally created using technologies such as a photo-etching technology. With this technology, metal (e.g., copper) material in the form of a foil or tape is etched on the top and bottom sides to create various pads and leads.

These technologies can be applied to a Quad-Flat No-leads (QFN) packages, where the designation "no-leads" denotes the fact that no leads are provided that protrude radially of the package.

So-called "pre-molded" leadframes are currently used that include electrically insulating resin such as epoxy resin, for instance, molded onto a sculptured (e.g., photo-etched) leadframe using a flat molding tool, for instance.

Spaces left in the etched metal material are filled by pre-molding resin and the resulting leadframe has a total thickness that is the same thickness of the original etched leadframe.

After pre-molding (with the molded resin solidified, via heat or UV curing, for instance), de-flashing and smearing processes can be applied to provide clean top/bottom metal surfaces.

Wettable flanks can be provided, e.g., during a second etching step that can be applied to the pre-molded leadframe to generate dedicated etched areas.

Also, an insulating encapsulation (an epoxy resin, for instance, not visible in the figures) can be molded onto the leadframe 12 having the chip(s) 14 and the signal propagation paths or lines 16A, 16B, 16C arranged thereon.

Advantageously (primarily in power applications) signal propagation paths or lines such as the paths or lines 16A, 16B, 16C can be produced in the form of a conductive ribbon, e.g., a narrow strip of aluminum (or copper, gold or any other material compatible with ultrasonic bonding) welded through ultrasonic bonding.

Unless indicated otherwise in the rest of the present description, examples as discussed in the foregoing are conventional in the art, which makes it unnecessary to provide a more detailed description herein.

Especially in power applications, devices 10 capable of being configured with different number of power channels are desirable.

For instance, in FIG. 1A the conductive ribbons 16A, 16B, 16C are electrically coupled (shorted) at the leadframe level to form a signal channel designated Ch #1. In FIG. 1B, the conductive ribbons 16A, 16B are electrically coupled (shorted) at the leadframe level and form a first signal channel designated Ch #1 and the conductive ribbon 16c is kept electrically separate from the conductive ribbons 16A and 16B and forms a second signal channel designated Ch #2. In FIG. 1C, the conductive ribbons 16A, 16B, 16C are not coupled with one another and form three distinct signal channels designated Ch #1, Ch #2, and Ch #3.

In conventional solutions as illustrated in FIGS. 1A to 1C these three different arrangements are mirrored by three respective, different leadframe layouts as shown at least by the difference in structures at the right side of each figure.

From a package perspective, this translates into different types of leadframe designs that take into account the number of channels involved. Such leadframe customization facilitates providing device characteristics as desired to render the final product functional.

From the viewpoint of the supply chain of the components, managing several leadframe versions, some of which may be dedicated just to a small number of products, is largely inconvenient.

A possible approach in addressing these issues may involve managing the different power channels at board level (e.g., with a printed circuit board or PCB) by bridging the leads with a wire connection.

For instance, a dual channel package could be shorted at board level to be used as a single channel device via short circuits (jumpers) at board level.

In such an approach (board customization) the underlying problem of having to manage different leadframe layouts is not properly solved. Rather, the problem is moved or displaced to the board design level, and is thus still present.

Moreover, board customization is almost invariably carried out by the final customer, which is largely impractical.

Also, it is noted that, with wire bridging, a new connection is added, involving two welds. This is in contrast with wedge bridging as discussed in the following, which is performed with one weld only.

Also, wire connection in some cases involves a dedicated area/pad, while a ribbon wedge can be bonded over an existing weld.

A wedge bonding process utilizes ultrasonic energy and pressure to create a bond. Wedge bonding is thus a low temperature process, where, for example, a wire or conductive ribbon (of aluminum, copper, gold or any other material compatible with ultrasonic bonding) is used to make the interconnection. This process deforms the wire/ribbon into a flat elongated shape of a wedge.

While wire bonding is already mature in semiconductor industry, bonding a conductive ribbon over different leads and conductive ribbons unexpectedly facilitates customizing power distribution in power packaging.

Particularly, wedge-on-wedge bridging as exemplified herein can be planned for critical package applications or developments, mostly for power application with the capability of meeting various specifications and flexibility in providing single-channel and multi-channel product versions.

Figure 2:
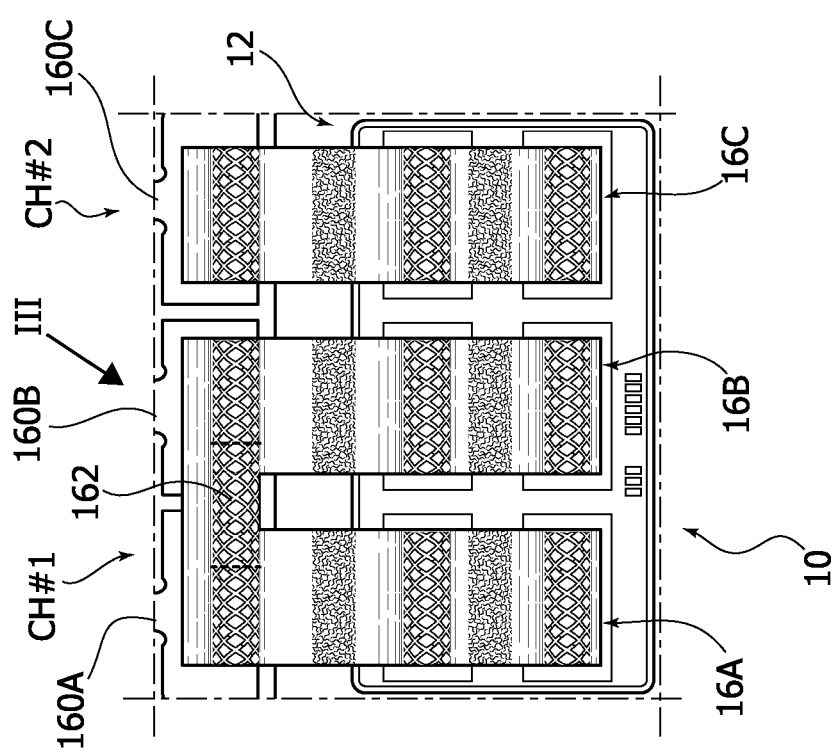
FIG. 2 is a plan view of a semiconductor device.

Examples as discussed herein in connection with figures from FIG. 2 onwards improve leadframe choice flexibility retaining a single multi-channel leadframe layout (e.g., of the type underlying an arrangement as illustrated in FIG. 1C, with three independent channels Ch #1, Ch #2, and Ch #3) by coupling (shorting) adjacent conductive ribbons 16A, 16B, 16C through a ribbon bonding process, bonding two adjacent leads, welding bridge-like a wedge over existing conductive ribbons, for instance. This may occur at the distal ends of these channels (conductive ribbons) that is at the "distal" pins or leads 160A, 160B, and 160C.

Examples as discussed herein thus expand on the concept of arranging over a substrate such as a leadframe 12 one or more semiconductor chips 14 and a plurality of current-carrying formations such as the conductive ribbons 16A, 16B, 16C coupled to the semiconductor chip(s), wherein the substrate (leadframe) 12 is exempt from electrically conductive formations coupling the current-carrying formations or conductive ribbons 16A, 16B, 16C.

That is, the substrate or leadframe 12 of FIGS. 2 to 5 is (always) of the type illustrated in FIG. 1C, configured to provide three channels CH #1, CH #2, and CH #3.

In the examples illustrated in FIGS. 2 to 5, at least one electrical contact 162 or 162A, 162B is formed between adjacent conductive ribbons 16A, 16B, 16C, with adjacent conductive ribbons 16A, 16B, 16C having at least one contact 162 or 162A, 162B formed therebetween coupled into a multi-formation current-carrying channel such as CH #1.

Figure 3:
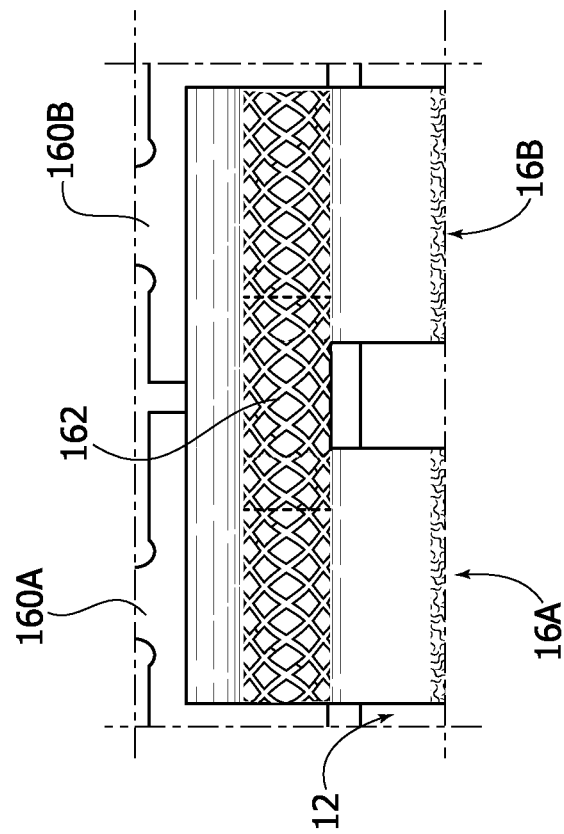
FIG. 3 is a view of the portion of FIG. 2 indicated by arrow III, reproduced on an enlarged scale.

For instance, FIGS. 2 and 3 illustrate a device 10 (not visible in its entirety) where: two conductive ribbons 16A, 16B are shorted at their distal pins or leads 160A, 160B via a wedge 162 welded, e.g., bridge-like between the pins or leads 160A, 160B to form a first current flow path or channel CH #1, and the third conductive ribbon 16C is maintained distinct at its distal pin or lead 160C to form a second current flow path or channel CH #2.

FIGS. 2 and 3 are thus exemplary of arranging over the substrate 12 a pair of a first current-carrying formation 16A and a second current-carrying formation 16B, the second current-carrying formation 16B being adjacent the first current-carrying formation 16A.

FIGS. 2 and 3 are likewise exemplary of arranging over the substrate 12 a third current-carrying formation 16C adjacent the pair comprised of the first 16A and second 16B current-carrying formations.

As illustrated in FIGS. 2 and 3 an electrical contact (wedge) 162 is formed between the pair of the first 16A and second 16B current-carrying formations.

The pair of the first 16A and second 16B current-carrying formations having the contact 162 formed therebetween are thus coupled to provide a first multi-formation current-carrying channel CH #1.

The third current-carrying formation 16C in turn provides a second single-formation current-carrying channel CH #2.

Again, by way of example, FIGS. 4 and 5 illustrate a device 10 (again not visible in its entirety) where: the conductive ribbons 16A and 16B are shorted at their distal pins or leads 160A, 160B via a first wedge 162A welded e.g., bridge-like, between the pins or leads 160A and 160B, and the conductive ribbons 16B and 16C are shorted at their distal pins or leads 160B, 160C via a second wedge 162B welded, e.g., bridge-like, between the pins or leads 160B and 160C.

In that way, all of the conductive ribbons 16A, 16B, and 16C are shorted by the wedges 162A and 162B at their distal pins to form a single current flow path or channel CH #1.

FIGS. 4 and 5 are thus exemplary of arranging over the substrate 12 a first current-carrying formation 16A and a second current-carrying formation 16B, the second current-carrying formation 16B adjacent the first current-carrying formation 16A.

FIGS. 4 and 5 are likewise exemplary of arranging over the substrate 12 a third current-carrying formation 16C adjacent the second current-carrying formation 16B, and: forming a first electrical contact (wedge) 162A between the first 16A and second 16B current-carrying formations, and forming a second electrical contact (wedge) 162B between the second 16B and third 16C current-carrying formations.

As illustrated in FIGS. 4 and 5, the first 16A, second 16B, and third 16C current-carrying formations having the first 162A and second 162B contacts formed therebetween are coupled to a single multi-formation current-carrying channel, namely CH #1.

While not shown for simplicity, a third possible option involves leaving the distal pins 160A, 160B, and 160C exempt from short-circuit paths as provided by wedges such as 162 or 162A, 162B.

In that case, the conductive ribbons 16A, 16B, and 16C are maintained (electrically) distinct at their distal pins or leads 160A, 160B, and 160C to form three different flow paths or channels CH #1, CH #2m and CH #3.

Examples as illustrated herein rely on wedge-on-wedge bridging; this is advantageous in improving the leadframe supply chain, providing selectivity in choosing lead bridging where desired.

Such wedge-on-wedge bridging can be easily detected thanks to the lead-to-lead connection inside the device package. Detection can be via X-Ray screening or by cross-section and SEM (Scanning Electronic Microscope) picture analysis. X-Ray analysis can be performed sidewise on the whole package body to detect the presence of bridges. Cross-sectional analysis can be performed where the bridge is detected by X-Ray.

Examples as illustrated herein rely on the possibility of bonding ribbons between two or more leads in order to bridge them. This feature facilitates higher flexibility in leadframe design.

Examples as illustrated herein improve leadframe choice flexibility by bridging pins through a ribbon bonding process.

Ribbon bonding as illustrated extends over two neighboring leads, welding a wedge over existing conductive ribbons. Bonding between two adjacent leads facilitates leadframe design standardization and improves product connection customization through connections that can be produced at the assembly level.

Examples as illustrated herein facilitate achieving a higher bonding flexibility, providing a wider leadframe (LF) choice without compromising on package cost.

For instance, a same QFN leadframe 12 (devised for a triple channel application CH #1, CH #2, CH #3) can be used for single-channel or two-channel applications as well.

It will be appreciated that same concept here exemplified by referring for simplicity to three conductive ribbons 16A, 16B, and 16C can be applied to any plural number of such conductive ribbons or current flow paths.

Bridging two or more of the channels (conductive ribbons) 16A, 16B, and 16C at their distal ends 160A, 160B, and 160C (opposite the semiconductor chip or chips 14) facilitates such a ribbon bonding process.

It will be otherwise appreciated that bonding two adjacent leads may occur also at other conductive ribbon locations, e.g., at their "proximal" ends adjacent the circuitry 14 and/or at intermediate points along the length of the conductive ribbons.

Similarly, while in the examples illustrated herein the contacts 162, 162A, and 162B are formed on top of the current-carrying formations (conductive ribbons) 16A, 16B, and 16C, in other examples a complementary arrangement can be adopted. In such a complementary arrangement, the contacts 162, 162A, and 162B are formed first and the current-carrying formations (conductive ribbons) 16A, 16B, and 16C subsequently applied (formed) thereon.

Without prejudice to the underlying principles, the details and embodiments may vary, even significantly, with respect to what has been described in the foregoing, by way of example only, without departing from the extent of protection.

The claims are an integral part of the technical teaching provided herein in respect of the embodiments.

The extent of protection is determined by the annexed claims.

The invention claimed is:

1. A method, comprising:
arranging at least one semiconductor chip over a substrate;
arranging a plurality of current-carrying formations coupled to the at least one semiconductor chip;
wherein the substrate does not include electrically conductive formations that electrically couple two or more current-carrying formations of the plurality of current-carrying formations to each other; and
forming at least one electrical contact between adjacent ones of the current-carrying formations in the plurality of current-carrying formations to provide a multi-formation current-carrying channel.

2. The method of claim 1, wherein arranging the plurality of current-carrying formations comprises:
arranging a pair of current-carrying formations including a first current-carrying formation and a second current-carrying formation, wherein the second current-carrying formation is adjacent the first current-carrying formation; and
arranging a third current-carrying formation adjacent the pair of current-carrying formations; and
wherein forming at least one electrical contact comprises forming an electrical contact between the first and second current-carrying formations of the pair of current-carrying formations to provide a first multi-formation current-carrying channel and wherein the third current-carrying formation provides a second single-formation current-carrying channel.

3. The method of claim 1, wherein arranging the plurality of current-carrying formations comprises:
arranging a first current-carrying formation;
arranging a second current-carrying formation adjacent the first current-carrying formation; and
arranging a third current-carrying formation adjacent the second current-carrying formation;
wherein forming at least one electrical contact comprises:
forming a first electrical contact between the first and second current-carrying formations; and
forming a second electrical contact between the second and third current-carrying formations;
wherein the first, second, and third current-carrying formations form a single multi-formation current-carrying channel.

4. The method of claim 1, wherein forming at least one electrical contact comprises forming said at least one electrical contact at distal ends of the adjacent current-carrying formations opposite a location of the at least one semiconductor chip.

5. The method of claim 1, wherein the current-carrying formations comprise electrically conductive ribbons arranged over the substrate.

6. The method of claim 1, wherein forming at least one electrical contact comprises performing wedge bonding at said adjacent ones of the current-carrying formations.

7. A device, comprising:
a substrate;
at least one semiconductor chip arranged on the substrate;
a plurality of current-carrying formations coupled to the at least one semiconductor chip;
wherein the substrate does not include electrically conductive formations that electrically couple two or more of the current-carrying formations in the plurality of current-carrying formations to each other; and
at least one electrical contact between adjacent ones of the current-carrying formations in the plurality of current-carrying formations to provide a multi-formation current-carrying channel.

8. The device of claim 7, wherein the plurality of current-carrying formations comprise:
a pair of current-carrying formations including a first current-carrying formation and a second current-carrying formation arranged over the substrate, the second current-carrying formation adjacent the first current-carrying formation; and
a third current-carrying formation arranged over the substrate adjacent the pair of current-carrying formations; and
wherein the at least one electrical contact comprises an electrical contact between the first and second current-carrying formations to provide a first multi-formation current-carrying channel, said third current-carrying formation providing a second single-formation current-carrying channel.

9. The device of claim 7, wherein the plurality of current-carrying formations comprise:
a first current-carrying formation arranged over the substrate;
a second current-carrying formation arranged over the substrate adjacent the first current-carrying formation; and
a third current-carrying formation arranged over the substrate adjacent the second current-carrying formation; and
wherein the at least one electrical contact comprises:
a first electrical contact between the first and second current-carrying formations; and
a second electrical contact between the second and third current-carrying formations;
wherein the first, second, and third current-carrying formations having said first and second electrical contacts provide a single multi-formation current-carrying channel.

10. The device of claim 7, wherein said at least one electrical contact is positioned at distal ends of the adjacent ones of the current-carrying formations opposite a location of the at least one semiconductor chip.

11. The device of claim 7, wherein the current-carrying formations comprise electrically conductive ribbons arranged over the substrate.

12. The device of claim 7, said at least one electrical contact comprises a wedge bond at said adjacent ones of the current-carrying formations.

* * * * *